United States Patent [19]

Haines

[11] 4,160,207
[45] Jul. 3, 1979

[54] PRINTED CIRCUIT BOARD TESTER WITH REMOVABLE HEAD

[76] Inventor: Fred E. Haines, 2444 Cabrillo Ave., Torrance, Calif. 90501

[21] Appl. No.: 810,574

[22] Filed: Jun. 27, 1977

[51] Int. Cl.² ..................... G01R 31/02; G01R 15/12
[52] U.S. Cl. ........................... 324/158 F; 324/73 PC
[58] Field of Search .................. 324/158F, 158P, 324/73 PC, 51

[56] References Cited

U.S. PATENT DOCUMENTS

| 3,564,408 | 2/1971 | Schulz et al. | 324/158 F |
| 3,654,585 | 4/1972 | Wickersham | 324/158 F |

OTHER PUBLICATIONS

Faultfinders Publication, "Your Answer . . . ", Faultfinders Inc., 15 Avis Drive, Latham, N.Y. 12110, 8-1976, pp. 1-8.

Primary Examiner—Rudolph V. Rolinec
Assistant Examiner—Ernest F. Karlsen
Attorney, Agent, or Firm—Huebner & Worrel

[57] ABSTRACT

A printed circuit board circuit tester comprising a testing head, electrical connectors carried by said head, wires and joined electrical contacts extending into said head from said connectors, the electrical contacts being fitted in a non-conducting environment supported in the head, supporting structure within the head adapted to support a circuit board to be tested, the electrical contacts extending through the non-conducting environment to a position adjacent the circuit board, apparatus operated by pressure differentials within the head for moving the circuit board into testing contact with the electrical contacts, a base on which said head is removably supported, base electrical connectors carried in said base and being adapted to mate with the electrical connectors carried in the head when said head is supported on said base, and wires and joined base electrical contacts extending from said base connectors into said base, said base electrical contacts being exposed through the base for connection to an electrical supply to test the circuit board. The base and head are removably locked together by bayonet locks in the base connectors and extending into the head connectors when they are mated. There is a lever externally of the base for locking and unlocking the bayonets.

17 Claims, 18 Drawing Figures

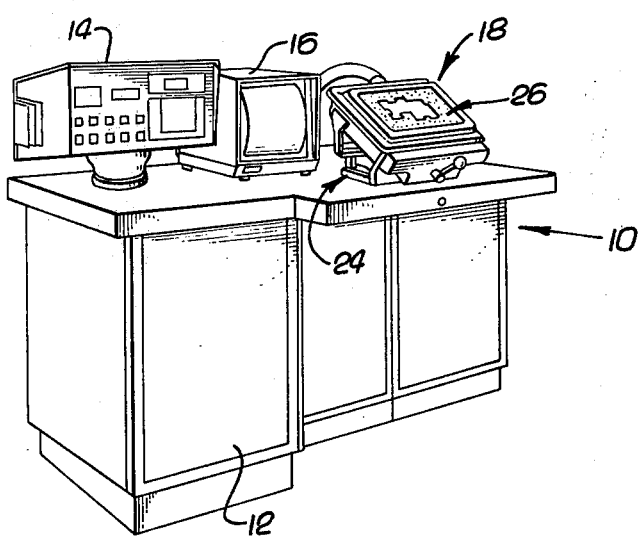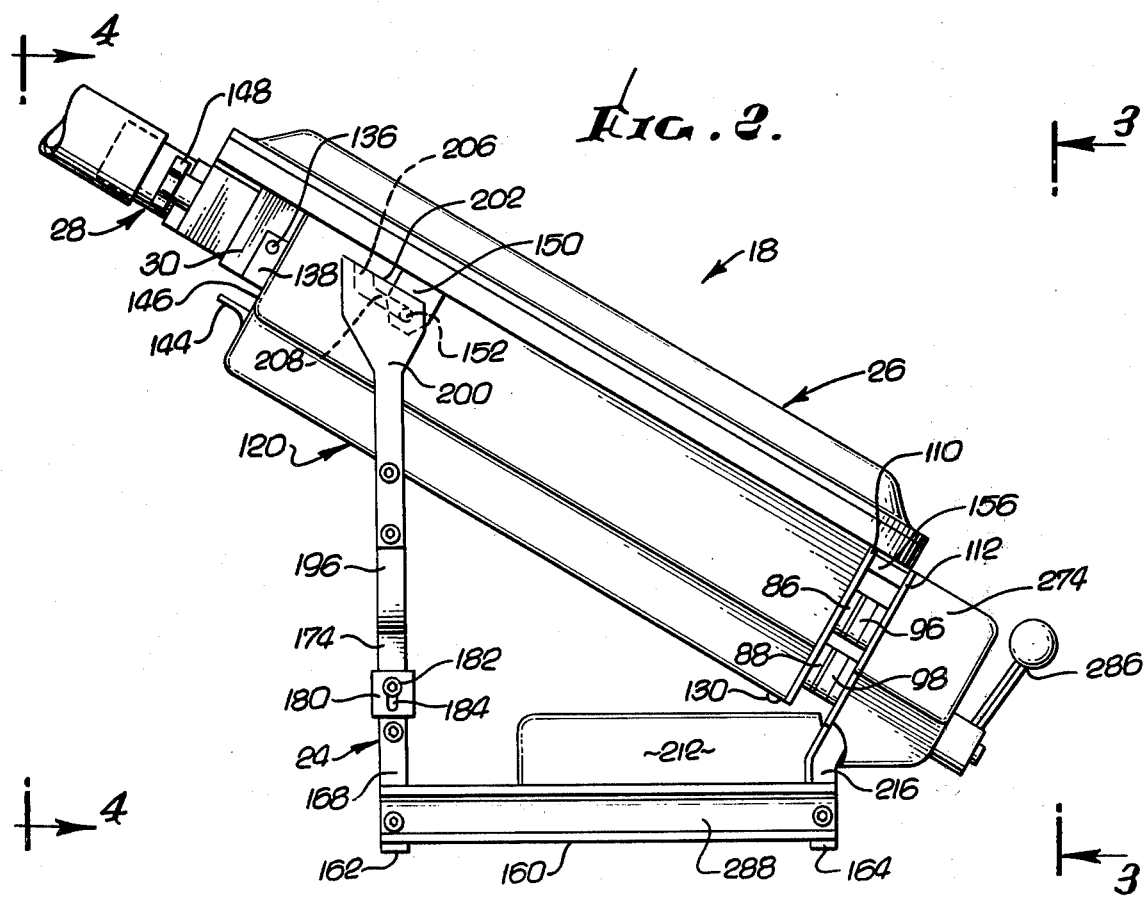

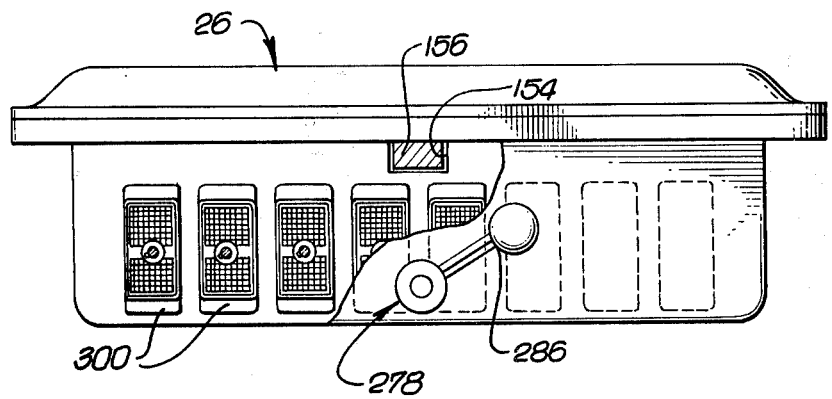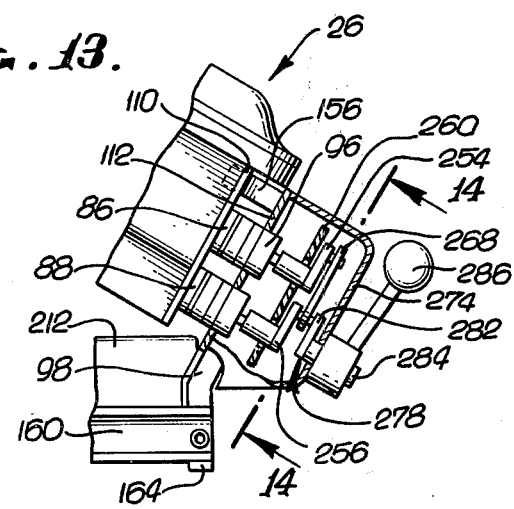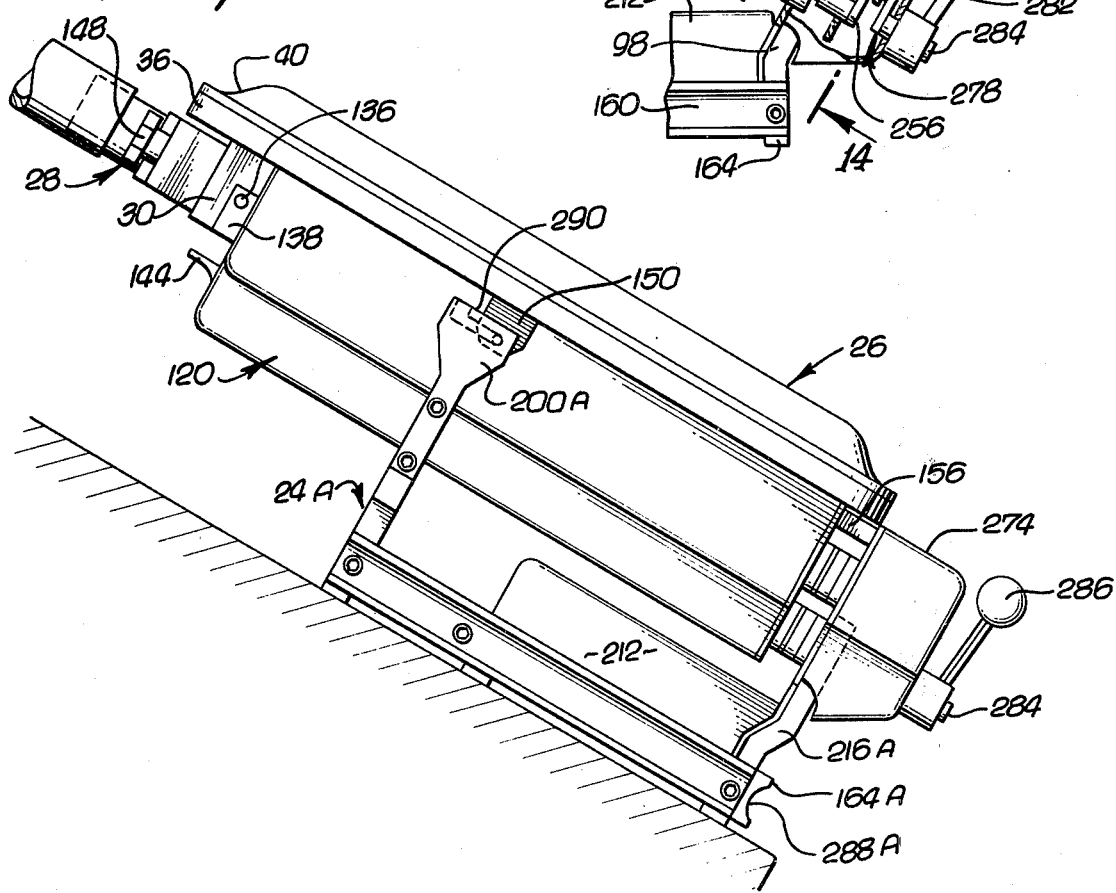

PRINTED CIRCUIT BOARD TESTER WITH REMOVABLE HEAD

BACKGROUND OF THE INVENTION

This invention is an improvement of my invention disclosed in U.S. Pat. No. 4,017,793.

The invention relates to testing equipment for printed circuit boards, and more particularly to such equipment in which a head part wired for a particular board may be easily removed and replaced with another head wired for another circuit board to be tested. In the aforesaid patent the head was generally secured to a base so as to remain so, and the entire tester generally would be removed from the testing console and replaced with another complete tester connected to the console for a different board to be tested. However, it should be noted in the above patent that arrangements were provided for testing different boards on one head. This is also possible with the present invention.

In the present invention the head and base are easily separable so that the base may remain fixed to the console and a head adapted to test a particular circuit board may be removed and replaced by another head adapted to test a different circuit or circuits.

The base is adapted to remain on the console with a multiplicity of electrical contacts available for connection to those in the console. The contacts and wires in the base extending from the console connections are fitted into a plurality of multiple connectors which are secured to the base. Each of these base connectors is adapted to be mated with a matching connector in the head. The head connectors have only the number of contacts secured therein as is required for the testing of a particular circuit board to be positioned on the head. During the testing operation, the tested circuits on the board are caused to be moved into contact with the electrical contacts wiped to the head connectors.

As in the aforesaid patent, vacuum or pressure means may be provided to move the circuit on the circuit board being tested into contact with the electrical contacts provided in the head for a particular circuit to be tested. The vacuum or pressure-providing arrangements in this invention are fully disclosed in the aforesaid patent.

SUMMARY OF THE INVENTION

The present invention is a printed circuit board tester which permits the easy interchangeability of heads for testing different boards or different circuits. In this invention a multiplicity of wires can be fitted into multiple connectors in a base which may be almost permanently situated on a testing console, and by such an arrangement the base itself can be made smaller and not extend as high off the console as required if the base had to be changed along with the head. By having the head easily securable into a standard base, the head also can be made thinner so that the combined head and base can be lower on the console and provide a smaller testing apparatus.

The making of the unit smaller is made possible in part by the use of mating multiple connectors which permit the electrical wires connected thereto to extend for the most part in the horizontal direction and not require the height where the wires extend generally in a vertical direction with respect to the testing console. The concept of having multiple connectors or plugs in the base which match and join respective connectors in the head is acceptable in the industry, and the connectors are such in which the contacts are joined or locked together by wiping to assure solid electrical contacts within the connectors themselves.

The invention also provides a less expensive way to install the wiring from the connectors in the base to the console connections, and, similarly, from the connectors in the head to the circuit board contacts.

The use of multiple contact connectors, and ready accessibility to them and to the wiring provided by the invention, makes it easier to correct a wiring mistake or make a change in the wiring arrangement, than in the prior art.

Another advantage of the invention is to permit the use of various sizes of heads to accommodate multiple circuit boards for testing.

The use of the multiple-type connectors permits any arrangement thereof that may be beneficial to save space. The connectors used are of the type which when joined together are locked by bayonets which actuate a cam to move or wipe the contacts into tight electrical connection.

It is an important object of the invention to provide a single lever which when actuated locks all of the multiple connectors together in the solid, wiped electrical contacts described above.

Further objects and advantages of the invention may be brought out in the following part of the specification wherein small details have been described for the competence of disclosure, without intending to limit the scope of the invention which is set forth in the appended claims.

BRIEF DESCRIPTION OF THE DRAWINGS

Referring to the accompanying drawings, which are for illustrative purposes:

FIG. 1 is a perspective view of a computer testing console, including a control console, a cathode ray tube terminal display, and circuit board tester, according to the invention;

FIG. 2 is a side elevational view of a circuit board tester of the type shown in FIG. 1;

FIG. 13 is a side elevational view of the mechanism by which all of the mating cnnectors in the base and head are locked together by means of a lever externally of the base;

FIG. 15 is a partially cutaway view of a joined head and base illustrating another arrangement of the connectors;

FIG. 17 is a view of the embodiment of the invention for use on a slanted console surface.

DESCRIPTION OF THE PREFERRED EMBODIMENTS

Referring again to the drawings, in FIG. 1 there is shown a circuit board system, generally designated as 10, comprised of a computer 12, a control console 14, a cathode ray terminal display 16, and a circuit board circuit tester 18, according to the invention.

Figure 7:
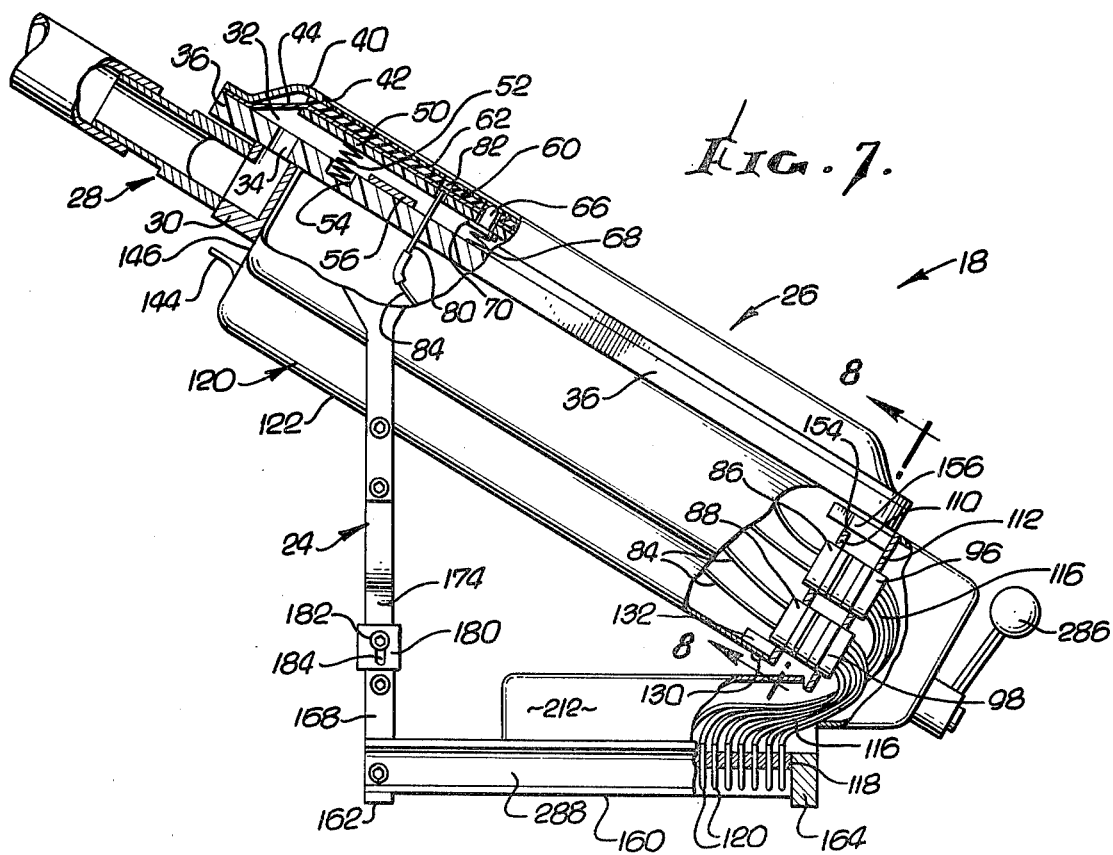
FIG. 7 is a side elevational cutaway view illustrating the wiring connections from the base to the circuit board testing contacts.

In FIGS. 2 and 7 the tester 18 is shown having a base, generally designated as 24, and a head, generally designated as 26. The head is removably supported on and may be locked to the base, as will be described.

The testing apparatus of the head is described in U.S. Pat. No. 4,017,793, and the description is repeated here, as desirable. The operating portions are comprised of a vacuum source 28 connected to a head vacuum manifold block 30, FIG. 7, which is open to a main vacuum chamber 32 by means of a plurality of passages 34 extending through a vacuum chamber phenolic bottom member 36. Secured to the member 36 is a marginal upper molded fiberglass retainer 40 having a large, generally rectangular central opening 42 extending over the edges of an elastomeric diaphragm or vacuum operable means 44. The diaphragm has its edges on those of the base member 36 and is sealingly secured thereto by the retainer 40, held in place by peripherally spaced screws 46, FIG. 3.

The diaphragm 44 is spaced upwardly from the member 36 by a generally rectangular flat rigid fiberglass sheet 50 and a plurality of spaced coil springs 52 in abutment with the lower side of the sheet 50, and having lower ends secured in recesses 54 in the member 36. Secured on the upper surface of the member 36 are a plurality of elastomeric spaced stop pads 56 which limit the downward movement of the sheet 50 and assure a vacuum passage along the top of the member 36. The main vacuum chamber 32 is formed between the diaphragm and the member 36.

Figure 3:
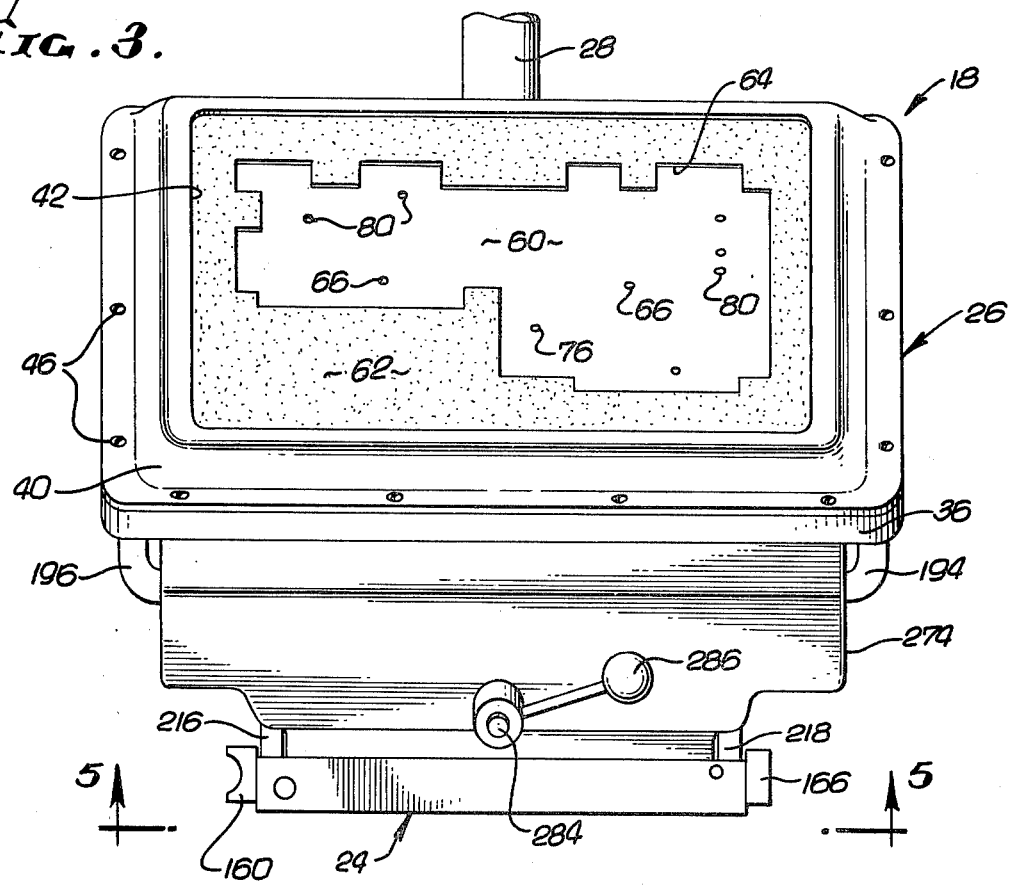
FIG. 3 is a front elevational view of the tester, taken along the lines 3—3 in FIG. 2.

Secured to the outer face of the diaphragm 50 is an elastomeric, generally rectangular, highly resilient, relatively firm foam pad 60, having its edges under the retainer 40 just outwardly of the opening 42. The foam sheet or pad 60 is positioned by means of two pins, not shown, secured within the member 36. Loosely positioned on the pad 60 is an elastomeric, highly resilient, foam sealing and spacing pad 62, FIG. 7, having a patterned cutaway central portion 64, so as to expose a central portion of the pad 60 from the top, as shown in FIG. 3. The configuration of the cutout portion 64 is determined by the printed circuit board to be tested, not shown, the circuits therein being exposed therethrough to the pad 60. The outer periphery of the pad 62 fits within the opening 42 in the retainer 40. The pad 62 is very soft, substantially collapsible, and about half as thick as the pad 60. The resilience of the pad 60 accommodates protrusions on the lower surface of the circuit board being tested, permitting the board to settle thereon.

Spring mounted on the member 36 are two printed circuit board positioning and locking pins 66, FIGS. 3 and 7, the lower end of coil springs 68, being on the upper surface of the member 36, and the upper ends of the springs being in contact with collars 70 fixed to the pins and in abutment with the rigid sheet 50. The pins 66, extending through the stated layers, are used to position and lock the circuit board to be tested, predetermined openings in the board being adapted to fit on the pins. The spring mounting is provided to permit tolerances in the boards and so as to avoid binding of the boards with the pins when the vacuum is applied.

A switch actuating pin 76, FIG. 3, not shown in detail, extends through the cutout portion 64, the vacuum chamber, and is slidably engaged through sheet 60, the diaphragm, the pad 50 and the member 36. Its lower end is supported by a leaf spring which when depressed closes another switch, not shown, so as to cause the vacuum to be applied to the vacuum chamber. The actuating pin 76 is automatically moved downwardly to close the switch when a circuit board is positioned thereon.

As shown in FIGS. 3 and 7, predeterminedly positioned, according to the circuit being tested, and fixed in the member 36 are a plurality of electrical contacts 80, each being in a non-conducting environment, including the member 36, and extending through the vacuum chamber and respective openings, generally designated as 82, in the sheet 50, the diaphragm and the pad 60. Extending downwardly from the contacts 80 are respective wires 84 secured to various head connectors, as 86, 88, 89, 92 and 94, FIGS. 7, 8 and 16. The connectors are of the type adapted to receive a multiplicity of electrical contacts and to be joined or mated with matching connectos, as 96, 98, 100, 101 and 104 in the base, FIGS. 7, 9 and 14. The head connectors are secured within a non-conducting frame member 110, supported on the plate member 36, on a bar 111, FIG. 16, and the base connectors are secured in a non-conducting plate 112, supported on the base.

Figure 5:
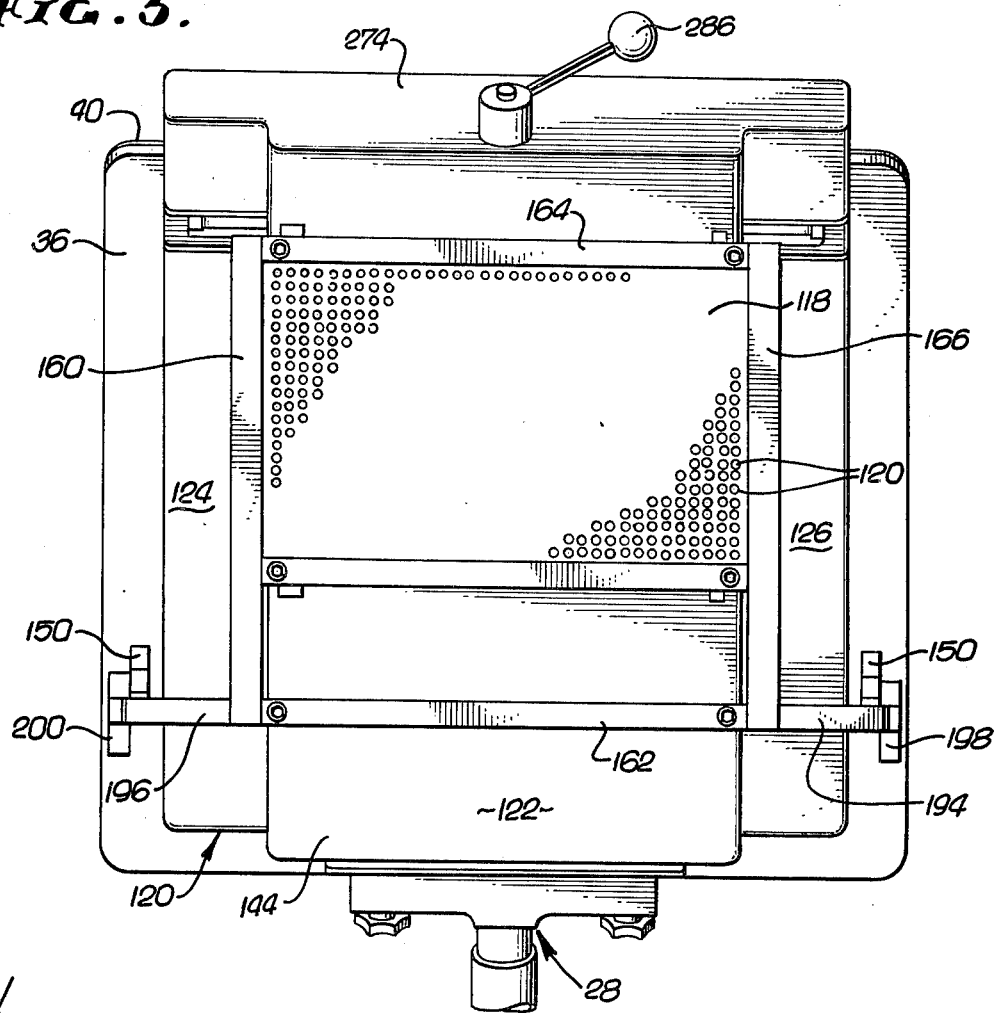
FIG. 5 is a bottom plan view of the tester, taken along the lines 5—5 in FIG. 3.
Figure 9:
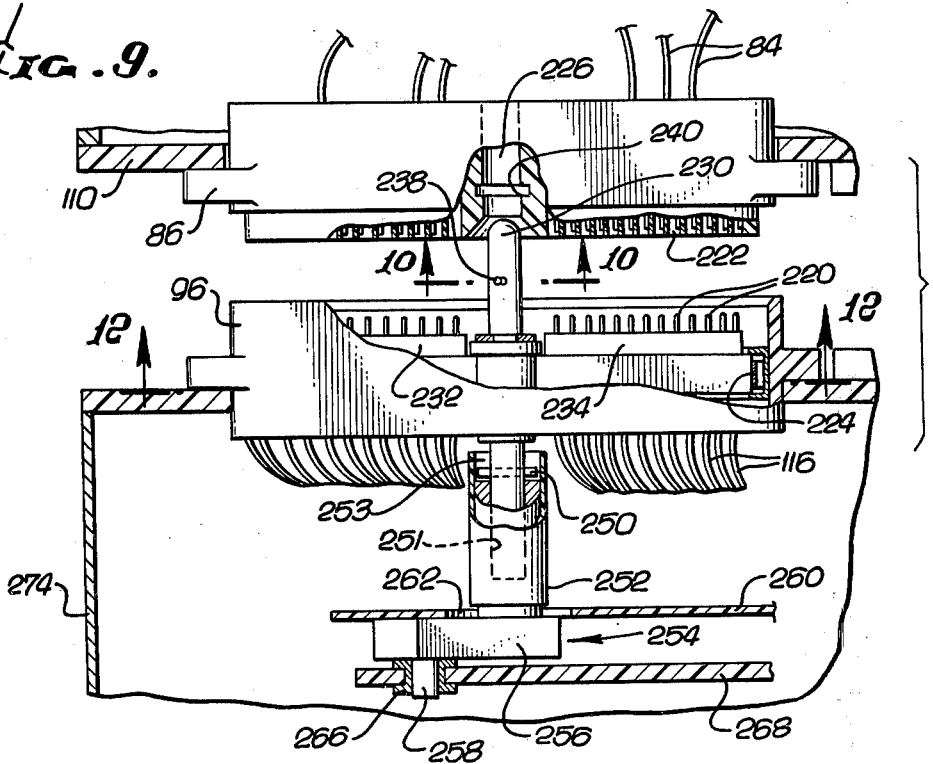
FIG. 9 is a fragmentary exploded view of two mating connectors, one in the base and one in the head, taken substantially along the lines 9—9 in FIG. 8.

A multiplicity of electrical wires 116 are secured in the base connectors and extend downwardly therefrom into a non-conducting plate 118 in which they are inserted in enlarged contact members 120, FIGS. 5, 7 and 9, adapted to be positioned on the console for selective connection to contacts there, providing for testing a multiple number of circuit boards selected according to the programming of the computer.

To test an individual circuit board, it is positioned with its marginal edges extending beyond the opening 64, FIG. 3, so as to overlap the pad 62 and be spaced from the pad 60 when positioned on the tester, two holes in the board being fitted on the pins 66, and when so fitted being positioned on the switch actuating pin 76 so as to cause the vacuum to be supplied to the main chamber 32, and also to a second chamber between the board being tested and the pad 60. When the vacuum is applied to the sheet 50, the diaphragm, the pad 60, the pad 62, and the circuit board, all are moved downwardly by the vacuum, so that the circuits on the board being tested make contact with the contacts 80. The downward pulling force on the board substantially collapses the inner edges of the soft seaing pad 62, compresses the pad 60 according to the lower surfaces on the board, and the entire structure from the board to the rigid sheet 60 is moved downwardly so that predetermined circuits in the board make contact with the contacts 80, whereby in accordance with computing programming each individual selected circuit on the board is tested, the test results being shown on a computer tape readout.

The vacuum applied may be as little as 5" of mercury, and when the test is completed it is shut off according to the computer program, thus allowing the springs 52 to return the printed circuit board to its upper position. The board is then removed and another one is positioned on the pins 66 for testing.

Figure 4:
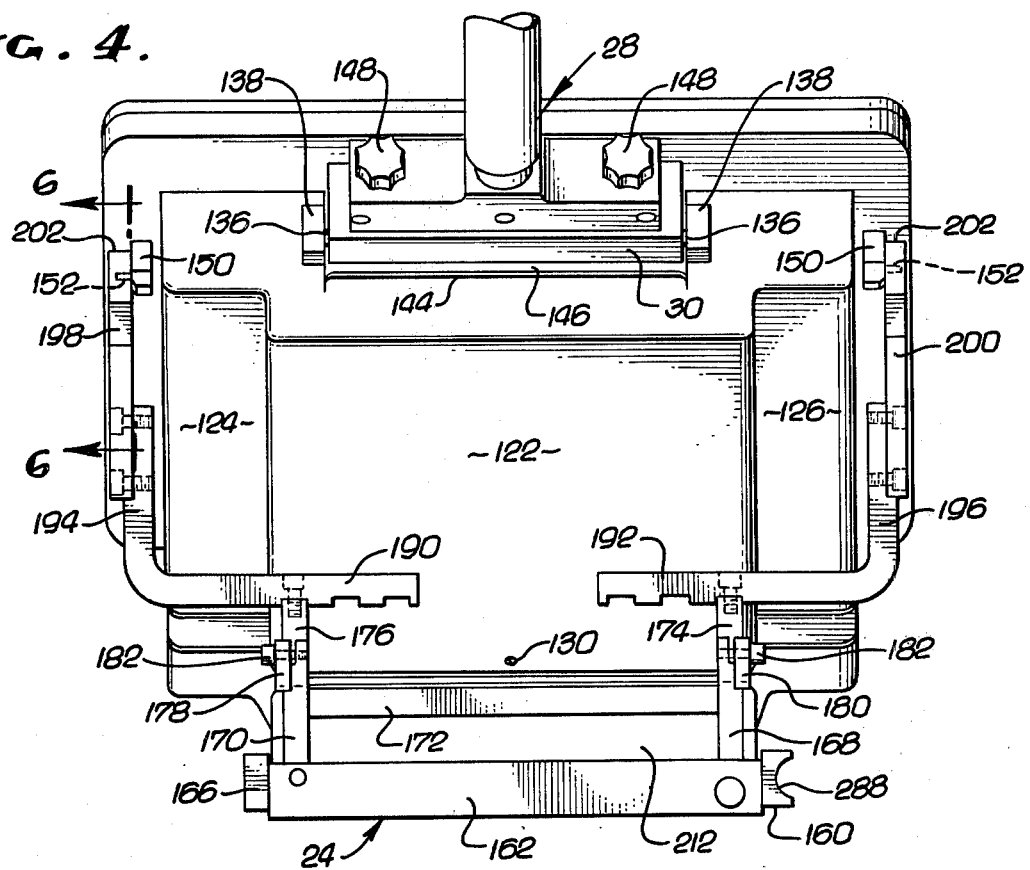
FIG. 4 is a rear elevational view, taken along the lines 4—4 in FIG. 2.
Figure 6:
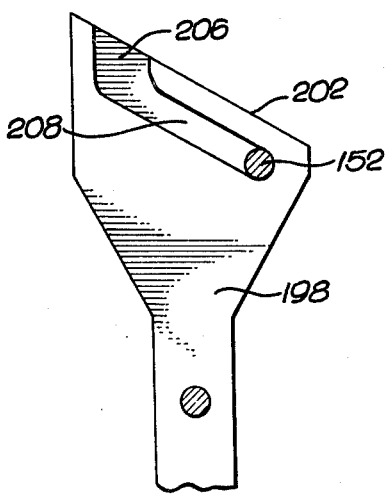
FIG. 6 is a fragmentary view illustrating a portion of the means for supporting the head on the base, taken along the lines 6—6 in FIG. 4.
Figure 16:
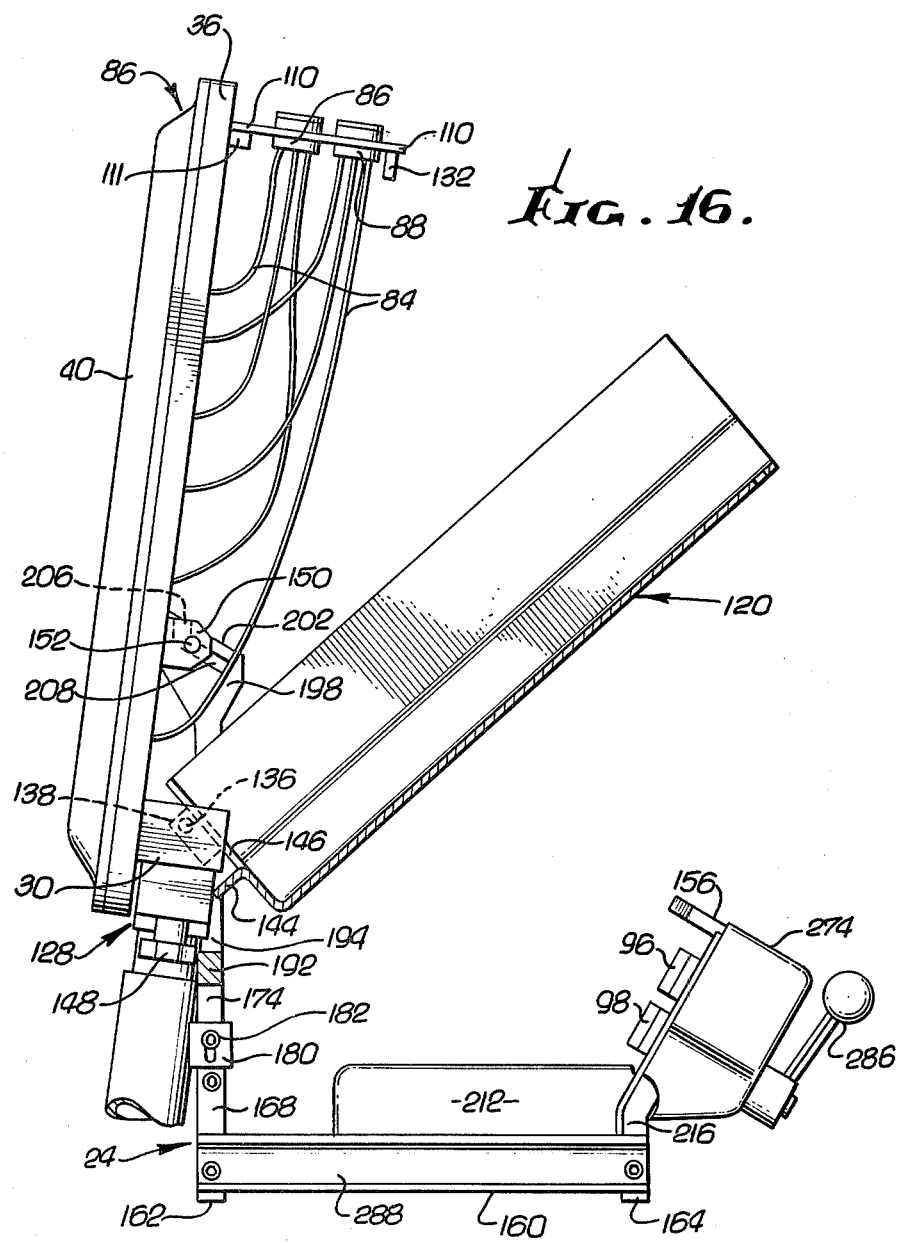
FIG. 16 is a partially cutaway view of the head on the base, the head being in an upright position and open for working therein without removing it from the base.

As shown in FIGS. 2-5, 7, 8, and 16, secured to and under the head plate 36 is a wire cover enclosure, generally designated as 120. The cover 120 in plan is generally rectangular and in front end view, FIG. 8, has a lower bottom surface 122 forming the base of a channel to accommodate the lower head connectors 88 and 92, and extending outwardly from the channel are horizontal portions 124 and 126 which widen the cover to accommodate the upper connectors. The cover is secured adjacent the connectors by means of a screw 130 threadedly engaged in a post 132 extending inwardly from the head connector plate 110, FIGS. 7, 16. Rearwardly the cover is secured to the vacuum manifold block 30 by pivot pins 136 extending into blocks 138 on the cover from both sides of the block 30, as shown in FIGS. 2, 4 and 16. The removal of the screw 130 permits the cover to pivot downwardly and expose the electrical leads between the head connectors and the plate 36. Below the block 30 extends a lip 144 spaced from the block and providing a slot opening 146 in the rear of the cover. This slot permits clearance for the pivotal opening of the cover away from the plate 36. The vacuum connection is secured to the block 30 by means of the knobs 148, FIGS. 2 and 4.

Secured to and extending downwardly from the plate 36 on both sides of the cover are blocks 150. Extending outwardly therefrom are pins or cam followers 152, FIGS. 2, 4 and 16. The pins 152 are adapted to support the rear or left end of the head when engaged with the base. Centrally, at the forward end of the head, directly below the plate 36, is a rectangular opening 154, FIGS. 7, 8, and 15, in the head connector plate 110, which is adapted to fit over guide, stop and support post 156 extending inwardly from the base connector plate 112.

The structure of the base 24 is best seen in FIGS. 2-7. As shown in FIGS. 5 and 7, the non-conducting supporting plate 118 for the contacts 120 is surrounded by four frame members 160, 162, 164 and 166. Extending upwardly at the rear left end of the frame member 162 are spaced parallel posts 168 and 170, and extending therebetween is a horizontal supporting member 172, FIG. 4. Hingedly connected to the posts 168 and 170 are vertical post members 174 and 176, respectively. The members 176 and 174 are locked against hinged movement by means of locking channels 178 and 180 being secured to the members 170 and 168, respectively, by means of Allen-head bolts 182, as shown in the channel 180, FIGS. 2 and 4. When the Allen nuts 182 are loosened the channels 178 and 180 may be raised to permit the members 174 and 176, and the members connected above, to be described, to be pivoted downwardly over the base to save space when not in use.

As best seen in FIG. 4, secured to the posts 174 and 176 are horizontal adjustable members 190 and 192 which extend outwardly of the base and then extend upwardly in vertical portions 194 and 196. Secured to the vertical portions 194 and 196 are respective post members 198 and 200, so as to form head support arms. The members 198 and 200 widen as they extend upwardly and have respective forwardly and downwardly slanted top surfaces 202. Cut into each of the inner faces of the portions 198 and 200 are vertical grooves 206, extending from the tops 202, and slanted grooves 208 parallel to the surfaces 202 forming L-shaped cam surfaces for the cam followers 152, FIGS. 2 and 16. Thus, when the pins 152 on the head are lowered into the grooves 206 they tend to slide downwardly and forwardly into the groove 208 to support the rear end of the head.

Between and above the frame members 160, 162, 164 and 166 is a fiberglas cover 212, fitted over the base wires 116. At the forward end of the base extending upwardly from the opposite ends of the member 164, as best seen in FIGS. 2, 3 and 13, are spaced vertical post portions 216 and 218. The post portions 216 and 218 extend upwardly and outwardly from their lower ends to support the base connector plate 112.

The guide and support post 156 on plate 112 stops the downward vertical movement of the head as it pivots on the pins 152 and then the opening 154 slides over it so that it supports the forward end of the head and guides the head connectors toward the respective base connectors.

Figure 12:
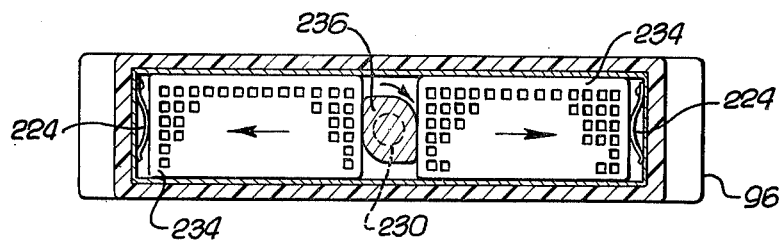
FIG. 12 is a view illustrating the locking-wiping arrangement in the connectors, taken along the lines 12—12 in FIG. 9.

As shown in FIG. 9, the base connectors have multiple electrical contacts 220 protruding therefrom and attached to the wires 116. The contacts 220 fit into respective openings 222 in the head connectors when the head and base are joined, as shown in FIGS. 7 and 13. The contacts attached to the wires 84 in the head connectors extend far enough inwardly so as to fit alongside the contacts 220 when the connectors are mated. Each base connector, as 96, in FIG. 9, h as a locking and guiding bayonet 230 extending therethrough. The outer openings, not shown, of the base connectors into which the wires 116 extend are fixed, but inwardly there are two groups of connector members 232 and 234 having openings on opposite sides of the bayonet through which the contacts 220 extend. The members 232 and 234 are spring biased by leaf springs 224, FIGS. 9 and 12, at their outer ends to normally be in an inward position. Fixed on the bayonets between the two groups are cams 236 so that when the bayonets are rotated 90° the two groups 232 and 234 are moved away from the bayonets from the unlocked positions shown to outer locked positions.

Figure 10:
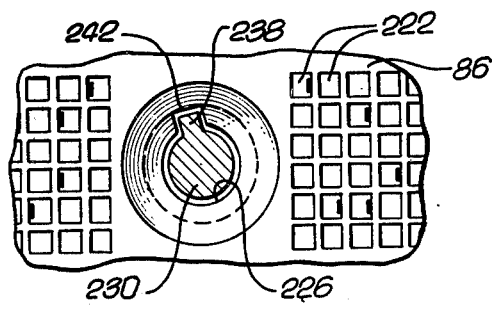
FIG. 10 is a view illustrating the bayonet and connector arrangement in the unlocked position, taken along the lines 10—10 in FIG. 9.
Figure 11:
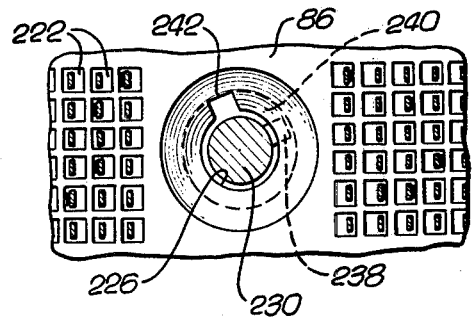
FIG. 11 is a view of the bayonet and mating connector in the locked position.

The bayonets also have transverse locking pins 238 adjacent their outer end. As shown in FIGS. 10 and 11, cylindrical openings 226 in the base connectors have slots 242 extending therealong to receive the pins 238. Thus, when the connectors are being joined, the transverse pins 230 are moved in the slots beyond shoulders 240 in the head connectors and 90° rotation of the bayonets from unlocked positions to locked positions rotates the pins 238 into locking engagement with the shoulders 240. The locking of the connectors occurs at the same time; the inner portions 232 and 234 of the base connectors are moved outwardly so as to cause the contacts 220 to wipe against the electrical contacts in the head connectors to form solid locked electrical contacts.

Figure 14:
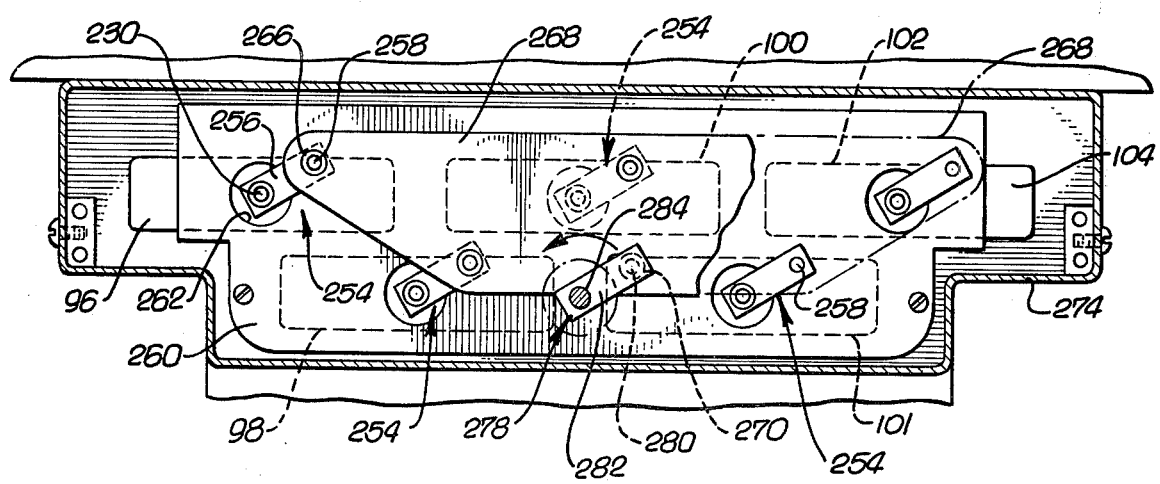
FIG. 14 is an elevational view of the multiple locking arrangement, taken along the lines 14—14 in FIG. 13.

As shown in FIGS. 9, 13 and 14, each bayonet 230 outwardly of the base connector has a transverse pin 250 extending therethrough. The outer end of the bayonet is slidably engaged in a bore 251 in a cylindrical member 252 forming one end of a driven crank, generally designated as 254. The inner end of the cylindrical portion 252 has a diametrical slot 253 in which the pin 250 extends so that rotation of the crank rotates and locks or unlocks the bayonet. At right angles to the cylindrical member 252 is one end of a bar portion 256 of the crank. The other end of the bar portion has a pin 258 extending at right angles in a direction opposite the cylindrical portion.

Around the cylindrical portions of the cranks, inwardly of the bar portions, there extends a wire shield 260 having openings 262 for the cylindrical portions to rotate therein. Each of the crank pins 258 is pivotally engaged in a grommet 266 secured in a shift plate 268. The shift plate is flat and has a configuration adapted to fit within the operating area.

As may be seen in FIGS. 2 and 13, a fiberglass cover 274 is joined to the base connector plate 112 and encloses the electrical contact wires, the wire shield 260, the cranks and the shift plate 268. Centrally positioned within the shift plate, adjacent its lower end, is a grommet 270 in which a pin 280 of driving crank 278 is pivotally engaged. At right angles to the pin 280 is a driving crank bar 282 and at its end, opposite the pin end, is a cylindrical portion 284 which extends through the cover 274. The cylindrical portion 284 is fitted to rotate within the cover and is rotated by a lever 286 externally of the cover.

Thus, when the pins or cam followers 152 are inserted into the vertical cam grooves 206 and the cam followers 152 are permitted to slide downwardly in the grooves 208, the guide and support post 156 slides into the opening 154 in the head connector plate 110, the head connectors move into the base connectors so as to mate, guided by the bayonets, and they are then in position for locking. The locking is accomplished by the rotation of the lever 286 which causes the driving crank bar 282 to rotate, pivoting the pin 280 in its grommet, and to shift the plate 268 in a rotary motion to cause the driven crank pins 258 to pivot in their grommets, and causes each of the individual cranks 254 to be rotated and to rotate the bayonets 230 so as to lock the connectors together and to cam the base connector portions 232 and 234 outwardly to make solid electrical contacts between the contacts in the base and head connectors.

When a head is thusly secured to a base, it is usually already positioned on the console, as shown in FIG. 1, held in place by a cam fitted in cylindrical groove 288 in frame member 160, FIGS. 2 and 4. It is then ready for operation and the circuit board tester to be tested is positioned thereon, the computer having been previously programmed to test the board. The ease of changing heads for a multiple number of boards is apparent from the foregoing, the removal of each head being accomplished by reversing the direction of the lever to unlock the connectors. When they are so unlocked, the head is moved upwardly to slide on the post 156 and the pins 152 slide upwardly in the cams. When the head is moved out of contact with the post 156 it may then be lifted off of the base.

If it is desired to check the circuitry within the head while it remains on the base, it may be moved farther upwardly, pivoting it on the pins 152 within the grooves 208 to an almost upright position, as shown in FIG. 16, where it will stand with the knobs 148 resting on the members 190 and 192. To open the head cover 120 the screw 130, FIG. 2, is removed and the cover allowed to pivot on its hinges 136 so that the wiring and contacts between the plate 36 and the head connectors are exposed for work therewith, either to check or correct for defects, or to make actual wiring changes.

In FIG. 1 the console is shown to have a flat top, and the base and head, as shown in FIG. 2, are used in such a position so that the circuit board is in a slanted position thereon for ease of operation by the operator.

Figure 18:
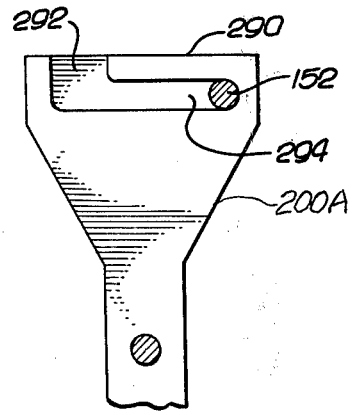
FIG. 18 is a fragmentary view of a portion of a head-supporting arm in the embodiment in FIG. 17.

In situations where the console has a slanted surface the embodiment, as shown in FIGS. 17 and 18, may be used. Here, the head is the same as in the foregoing, but the base 24A and its support arms 200A are of a slightly different configuration. The arms extend upwardly from the base 24A at right angles in the same manner as the supports 198 and 200, but the top surface 290 is parallel to the surface of the base. The groove opening 292 is generally vertical, but the other portion 294 of the L-shaped groove is parallel to the base. Thus, when the cam followers 152 are moved into the groove portion 294, the head is moved parallel to the slanted base and onto the guide post 156. At the front end of the base, connector plate supports 216A are generally vertical when not on the console and base member 164A has cylindrical groove 288A for securing it to the console. With this embodiment the remainder of the various operations are the same.

Figure 8:
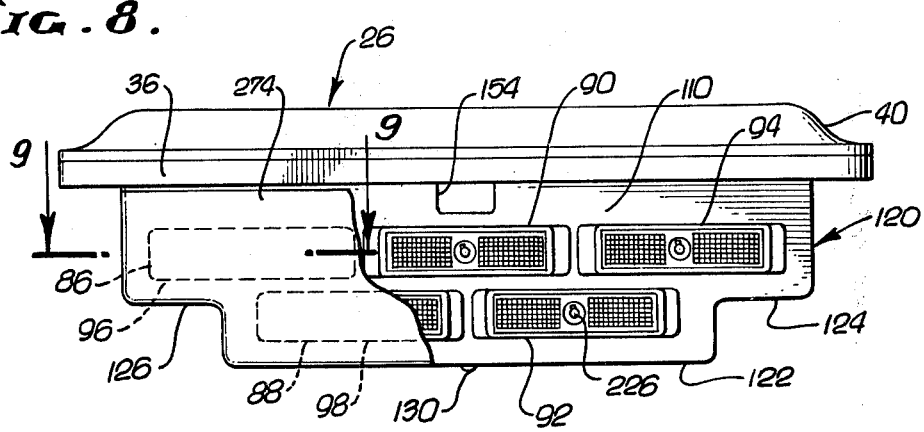
FIG. 8 is a view taken substantially along the lines 8—8 in FIG. 7.

In FIG. 15 another embodiment of the invention is shown in which the connectors 300 are extending vertically and parallel as distinct from the arrangement as shown in FIG. 8. In this embodiment the configuration of the shift plate is slightly different from that of plate 268, but the lever action in operating the driving crank and the driven cranks in the connectors is the same. This embodiment is shown to illustrate the possibility of positioning the connectors as may be desirable for space or other considerations.

The invention and its attendant advantages will be understood from the foregoing description and it will be apparent that various changes may be made in the form, construction and arrangements of the parts of the invention without departing from the spirit and scope thereof or sacrificing its material advantages, the arrangements hereinbefore described being merely by way of example. I do not wish to be restricted to the specific forms shown or uses mentioned except as defined in the accompanying claims, wherein various portions have been separated for clarity of reading and not for emphasis.

I claim:

1. In a printed circuit board circuit tester having a testing head,
   head electrical wires and joined head contact means extending into said head,
   said head electrical contact means being fitted in a non-conducting environment supported in the head,
   support means within said head adapted to support a circuit board to be tested,
   said head electrical contact means extending through said non-conducting environment to a position adjacent said circuit board support means and said circuit board,
   means associated with said head for moving said circuit board into testing contact with said head electrical contact means, the improvement comprising:

head electrical connector means carried by said head, said head electrical wires extending from said head electrical connector means, a base for removably supporting said head, base electrical connector means carried in said base and being adapted to mate with said head electrical connector means when said head is supported on said base, base electrical wires and joined electrical contact means extending from said base connector means into said base, said base electrical contact means being exposed through said base for connection to an electrical supply to test said circuit board, upwardly extending spaced arms on one side of said base having means to slidably engage with and support said head adjacent one end thereof, means extending from said head to respectively slidably engage said arms, and head stop means extending from an opposite side of said base to slidably engage with said head when said means extending from said head slidably engages with said arms, said stop means and said arms being adapted to support said head on said base.

2. In a printed circuit board circuit tester having a testing head, head electrical wires and joined head contact means extending into said head, said head electrical contact means being fitted in a non-conducting environment supported in the head, support means within said head adapted to support a circuit board to be tested, said head electrical contact means extending through said non-conducting environment to a position adjacent said circuit board support means and said circuit board, means associated with said head for moving said circuit board into testing contact with said head electrical contact means, the improvement comprising:

head electrical connector means carried by said head, said head electrical wires extending from said head electrical connector means, a base for removably supporting said head, base electrical connector means carried in said base and being adapted to mate with said head electrical connector means when said head is supported on said base, base electrical wires and joined electrical contact means extending from said base connector means into said base, said base electrical contact means being exposed through said base for connection to an electrical supply to test said circuit board, rotatable and guiding bayonet locking means in said base connector means and extending to said head connector means when said connector means are mated, said bayonet locking means having a transverse pin extending therefrom, said transverse pin being adapted to pass through a slot in said head connector means to be adjacent a shoulder therein facing away from said base connector means, whereby rotation of bayonet means rotates said transverse pin to be in locking engagement with said shoulder, and means associated with said base for rotating said bayonet locking means to be in locking engagement.

3. In a printed circuit board circuit tester having a testing head, head electrical wires and joined head contact means extending into said head, said head electrical contact means being fitted in a non-conducting environment supported in the head, support means within said head adapted to support a circuit board to be tested, said head electrical contact means extending through said non-conducting environment to a position adjacent said circuit board support means and said circuit board, pressure differential means associated with said head for moving said circuit board into testing contact with said head electrical contact means, the improvement comprising:

head electrical connector means carried by said head, said head electrical wires extending from said head electrical connector means, a base for removably supporting said head, base electrical connector means carried in said base and being adapted to mate by means of solid wiping contacts with said head electrical connector means when said head is supported on said base, base electrical wires and joined electrical contact means extending from said base connector means into said base, said base electrical contact means being exposed through said base for direct connection to an electrical supply to test said circuit board, and means associated with said head and base connector means for locking said connector means together and for locking said head and base together when said connector means are mated.

4. The invention according to claim 1 in which:

said connector means in said head and base are in position to mate when said stop means and said legs are supporting said head, said connector means in said base being adjacent said stop means.

5. The invention according to claim 1 in which:

said means on said arms for slidable engagement are L-shaped grooves having one part of the L open at the top of the respective arms, the other part of the L extending toward the stop means, said means extending from said head being pins adapted to slide into respective one parts of said L-shaped grooves and then into said other parts toward said stop means.

6. The invention according to claim 5 in which:

said stop means is a post adapted to fit into an opening in said head to stop the vertical downward movement of the head, said connector means being adapted to mate when said pins are moved in said other parts of said grooves toward said post and said head slides on said post toward said base connectors.

7. The invention according to claim 6 including:

a plurality of said mating connector means in said head and base, rotatable bayonet locking means in each of said base connector means and extending into each of said head connector means when said connector means are mated, said bayonet locking means having a transverse pin extending therefrom adjacent an outer end toward said head connectors, said transverse pin being adapted to pass through a slot in each said head connector means to be adjacent a shoulder therein facing away from said base connector means, whereby rotation of said bayonet means rotates said transverse pin to be in locking engagement with said shoulder, and means associated with said base for rotating said bayonet locking means to be in locking engagement.

8. The invention according to claim 7 in which:

said means for rotating said bayonet locking means include respective rotation means associated with each bayonet means, means connected to each of said respective rotation means adapted to rotate all of said last means simultaneously, actuating means externally of said base to actuate said means connected to lock all of said mated connectors simultaneously.

9. The invention according to claim 8 in which:

said rotation means are driven cranks, each having one end thereof connected for rotation to a bayonet locking means and having its other end pivotally connected to said means connected, said means connected being a shift plate having one end of a driving crank pivotally connected thereto, the other end of the driving crank being connected for rotation by the actuating means, said actuating means being a lever fitted to the base and being adapted to rotate said driving crank, whereby when said lever is rotated, said shift plate is shifted in its plane to cause said driven cranks to pivot therewith so as to rotate them and said bayonets into locked and unlocked positions.

10. The invention according to claim 9 in which:

said base and head connector means each have a multiple number of sockets to receive respective electrical contact means, each socket being adapted to receive one electrical contact, said contacts in said base connector means protruding therefrom to enter respective sockets in said head connector means to make contact with said electrical contact means therein, said sockets being divided into two groups with a bayonet locking means generally spaced therebetween, said base connector means having a cam adapted to rotate on said bayonet locking means, an outer portion of said base sockets toward said head connector means in said base connector means being spring biased to move toward said bayonet locking means in the unlocked position and in the opposite direction in the locked position by the cam, whereby said protruding electrical contact means in each base socket is moved into tight electrical contact with electrical contact means in the head connector means when said connectors are locked.

11. The invention according to claim 2 in which:

said means for rotating said bayonet locking means include respective rotation means associated with each bayonet means, means connected to each of said respective rotation means adapted to rotate all of said last means simultaneously, actuating means externally of said base to actuate said means connected to lock all of said mated connectors simultaneously.

12. The invention according to claim 11 in which:

said rotation means are driven cranks, each having one end thereof connected for rotation to a bayonet locking means and having its other end pivotally connected to said means connected, said means connected being a shift plate having one end of a driving crank pivotally connected thereto, the other end of the driving crank being connected for rotation by the actuating means, said actuating means being a lever fitted to the base and adapted to rotate said driving crank, whereby when said lever is rotated said shift plate is shifted in its plane to cause said driven cranks to pivot therewith and so as to rotate them and said bayonets into locked and unlocked position.

13. The invention according to claim 1 including:

a cover forming an enclosure on an underside of said head adapted to enclose said electrical contact means and wires extending from said head connector means and to enclose an underside of said non-conducting environment, said head being pivotal upwardly to an at rest position on said means extending therefrom and slidably engaging said arms, said cover being hinged to the underside of said head adjacent said one end thereof and being adapted to hingedly move downwardly from an upper portion of the head to expose said last electrical contact means and said non-conducting environment.

14. The invention according to claim 5 including:

a cover forming a lower portion of the head and enclosing an underside thereof and being adapted to enclose said electrical contact means and wires extending from said head connector means and to enclose an underside of said non-conducting environment, said head being pivotal upwardly to an at rest position on said pins in said grooves, said cover being hinged to the underside of said head adjacent said one end thereof and being adapted to hingedly move downwardly from an upper portion of the head to expose said last electrical contact means and said non-conducting environment, and means to secure said cover adjacent an end of said head opposite said one end in an upper enclosing position.

15. The invention according to claim 3 including:

means externally of and associated with said base for actuating said locking means.

16. The invention according to claim 3 in which:

said connectors are adjacent one end of said head, support means extending upwardly from said base to engage and support a portion of said head spaced from said connectors.

17. The invention according to claim 3 in which:

head support means are adjacent said connectors and extending from said base, said head support means being adapted to engage said head for support and for guiding said connectors as they are moved into mating engagement.

* * * * *